(12) United States Patent
Chen et al.

(10) Patent No.: US 11,837,610 B2
(45) Date of Patent: Dec. 5, 2023

(54) ARRAY SUBSTRATE AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Jianfeng Chen, Hubei (CN); Shuyuan Zhang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 358 days.

(21) Appl. No.: 17/265,859

(22) PCT Filed: Nov. 13, 2020

(86) PCT No.: PCT/CN2020/128578
§ 371 (c)(1),
(2) Date: Feb. 4, 2021

(87) PCT Pub. No.: WO2022/041496
PCT Pub. Date: Mar. 3, 2022

(65) Prior Publication Data
US 2022/0310668 A1    Sep. 29, 2022

(30) Foreign Application Priority Data

Aug. 28, 2020    (CN) .......................... 202010882236.8

(51) Int. Cl.
*H01L 27/12*    (2006.01)

(52) U.S. Cl.
CPC ...... *H01L 27/1248* (2013.01); *H01L 27/1244* (2013.01)

(58) Field of Classification Search
None
See application file for complete search history.

(56) References Cited

U.S. PATENT DOCUMENTS

| 2020/0027903 A1* | 1/2020 | Tian ..................... H10K 59/131 |
| 2020/0243778 A1 | 7/2020 | Li |
| 2021/0184140 A1* | 6/2021 | Zhao .................... H10K 77/111 |

FOREIGN PATENT DOCUMENTS

| CN | 107910350 A | 4/2018 |
| CN | 108364961 A | 8/2018 |
| CN | 108899334 A | 11/2018 |

(Continued)

OTHER PUBLICATIONS

Translation of CN 107910350, total pp. 11 (Year: 2018).*

*Primary Examiner* — Bo B Jang
(74) *Attorney, Agent, or Firm* — PV IP PC; Wei Te Chung; Zhigang Ma

(57) ABSTRACT

An array substrate and a display device are provided. A functional layer of the array substrate is provided with a first opening in a bending region. A filling layer covering the functional layer fills the first opening and provides a second opening at a position of the first opening. A metal layer of the array substrate includes a plurality of metal traces, and the metal traces are bent toward an inside of the second opening in a region overlapping with the second opening.

20 Claims, 4 Drawing Sheets

(56) References Cited

FOREIGN PATENT DOCUMENTS

| CN | 109585511 A | | 4/2019 | |
|---|---|---|---|---|
| CN | 111524902 A | | 8/2020 | |
| CN | 109300964 B | * | 10/2020 | ......... H01L 27/3246 |

* cited by examiner

ARRAY SUBSTRATE AND DISPLAY DEVICE

FIELD OF INVENTION

The present invention relates to the field of display technologies, and in particular, to an array substrate of a display device.

BACKGROUND OF INVENTION

In the field of display technologies, flat-panel display devices such as liquid crystal display (LCD) devices and organic light emitting diode (OLED) display devices have gradually replaced CRT displays.

An LCD display device is composed of a thin film transistor array substrate (TFT array substrate) and a color filter (CF) substrate bonded together, and liquid crystals are filled between the TFT substrate and the CF substrate. Liquid crystal molecules are controlled to change directions by energizing them or not, and light from a backlight module is refracted to produce a picture.

OLEDs have many advantages such as self-luminescence, low driving voltage, high luminous efficiency, short response times, high definition and contrast, nearly 180° viewing angle, wide operating temperature range, flexible display, and large-area full-color display, etc., and are recognized by the industry as the most promising display devices. An OLED display device usually comprises a substrate, an anode disposed on the substrate, a hole injection layer disposed on the anode, a hole transport layer disposed on the hole injection layer, a light emitting layer disposed on the hole transport layer, an electron transport layer disposed on the light emitting layer, an electron injection layer disposed on the electron transport layer, and a cathode disposed on the electron injection layer. A principle of luminescence is that semiconductor materials and organic luminescent materials are driven by an electric field to cause luminescence through carrier injection and recombination. With a current market trend, panels enter an era of flexibility. Related to a development of flexible panels, flexible foldability has become a mainstream direction of small-sized mobile phones, and flexible OLED display devices will be a mainstream market in the future. Among them, dynamic foldable products will become a top priority of small and medium display industries. When bending or folding, metal traces in a display panel are easily broken, causing abnormal images in a display region. However, an adhesion between film layers of the display panel is limited, and the film layers are likely to separate from each other after bending, which seriously affects a yield rate, and even causes a threshold voltage (VTH) of a thin film transistor to drift and cause uneven light emission. Therefore, the display panel needs to have a more stable structure to meet requirements of bending resistance, and dynamic stretch and bending durability of flexible panels or materials need to be guaranteed.

Technical Problem

The present invention provides an array substrate with a stable structure and a display device with the array substrate, which can meet requirements of dynamic stretching and bending, preventing cracks and effects on a normal operation of thin film transistors.

Technical Solution

In a first aspect, an embodiment of the present invention provides an array substrate comprising: a bending region and a non-bending region; and a base layer, a buffer layer, a functional layer, a filling layer, and a metal layer stacked in sequence;

wherein the functional layer comprises a first portion located in the non-bending region and a second portion located in the bending region, the first portion is provided with a plurality of driving thin film transistors, and the second portion is provided with a first opening; the filling layer covers an upper surface of the functional layer and fills the first opening, and the filling layer is provided with a second opening at the first opening; and the metal layer comprises a source-drain pattern and a plurality of metal traces connected to the source-drain pattern, and the metal traces are bent toward an inside of the second opening in a region overlapping with the second opening.

In the array substrate, the first opening extends into the base layer.

In the array substrate, the first opening comprises an upper opening and a lower opening, the lower opening is located below the upper opening, and a horizontal cross-sectional area of the lower opening is less than a horizontal cross-sectional area of the upper opening.

In the array substrate, the upper opening, the lower opening, and the second opening are all trapezoidal cross-sections that are wide at top and narrow at bottom along a depth direction of an opening.

In the array substrate, the metal trace is at least partially attached to a bottom surface of the lower opening of the first opening.

In the array substrate, a plurality of the second openings overlap the metal traces and are defined at equal distances from each other along an extension direction of the metal traces.

In the array substrate, a maximum opening length of the second opening along the extension direction of the metal traces is greater than a distance between two adjacent second openings along the extension direction of the metal traces, and an opening width of the second opening perpendicular to the extension direction of the metal traces is greater than a width of the metal trace.

In the array substrate, two rows of the second openings defined along the extension direction of the adjacent metal traces are arranged in a staggered manner.

In the array substrate, each of the driving thin film transistors is provided with a third opening on a periphery, a horizontal cross-section of each third opening is a rectangle with a same size, and a long side of the third opening faces the driving thin film transistor.

In the array substrate, the third opening passes through the functional layer and the buffer layer along a depth direction of an opening, and the filling layer fills the third opening.

In a second aspect, the embodiment of the present invention further provides a display device, The display device comprises: an array substrate, wherein the array substrate comprises a bending region and a non-bending region, and a base layer, a buffer layer, a functional layer, a filling layer, and a metal layer stacked in sequence; wherein the functional layer comprises a first portion located in the non-bending region and a second portion located in the bending region, the first portion is provided with a plurality of driving thin film transistors, and the second portion is provided with a first opening; the filling layer covers an upper surface of the functional layer and fills the first opening, and the filling layer is provided with a second opening at the first opening; and the metal layer comprises a source-drain pattern and a plurality of metal traces connected to the source-drain pattern, and the metal traces are bent toward an inside of the second opening in a region overlapping with the second opening.

In the display device, the first opening extends into the base layer.

In the display device, the first opening comprises an upper opening and a lower opening, the lower opening is located below the upper opening, and a horizontal cross-sectional area of the lower opening is less than a horizontal cross-sectional area of the upper opening.

In the display device, the upper opening, the lower opening, and the second opening are all trapezoidal cross-sections that are wide at top and narrow at bottom along a depth direction of an opening.

In the display device, the metal trace is at least partially attached to a bottom surface of the lower opening of the first opening.

In the display device, a plurality of the second openings overlap the metal traces and are defined at equal distances from each other along an extension direction of the metal traces.

In the display device, a maximum opening length of the second opening along the extension direction of the metal traces is greater than a distance between two adjacent second openings along the extension direction of the metal traces, and an opening width of the second opening perpendicular to the extension direction of the metal traces is greater than a width of the metal trace.

In the display device, two rows of the second openings defined along the extension direction of the adjacent metal traces are arranged in a staggered manner.

In the display device, each of the driving thin film transistors is provided with a third opening on a periphery, a horizontal cross-section of each third opening is a rectangle with a same size, and a long side of the third opening faces the driving thin film transistor.

In the display device, the third opening passes through the functional layer and the buffer layer along a depth direction of an opening, and the filling layer fills the third opening.

BENEFICIAL EFFECT

Compared with the prior art, technical solutions of the present invention can effectively improve structural stability of an array substrate during dynamic bending, prevent stress damage to a film structure and a threshold voltage drift of a driving thin film transistor caused by stress from affecting normal operation, and reduce stress on metal traces in a bending region.

DETAILED DESCRIPTION OF PREFERRED EMBODIMENTS

The present invention provides a touch electrode layer and a touch display device. In order to make the purpose, technical solutions, and effects of the present invention clearer and more explicit, the following further detailed description of the present invention with reference to the attached drawings and examples of implementation. It should be understood that the specific embodiments described here are only used to explain the present invention, and not to limit the present invention.

Figure 1:
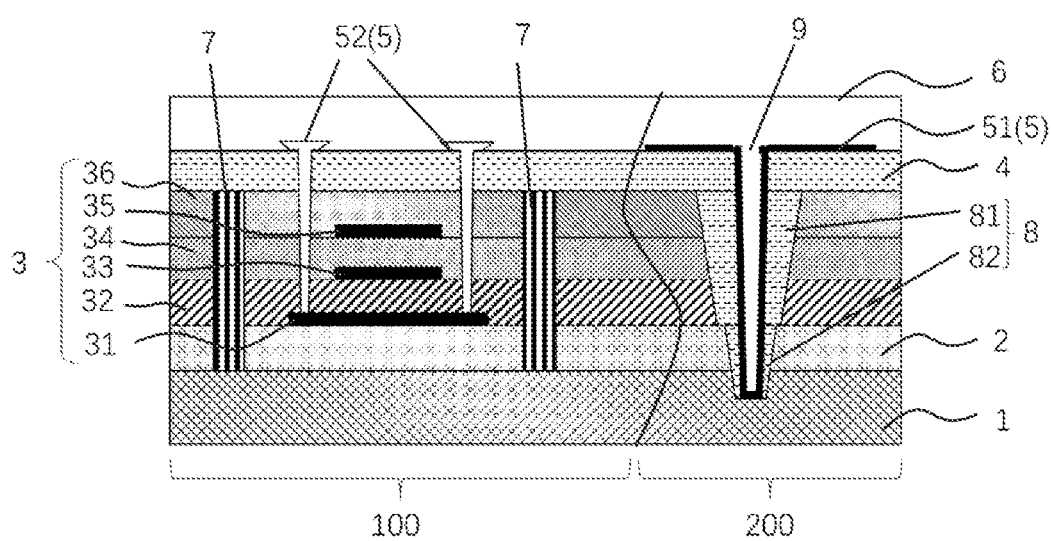
FIG. 1 is a schematic structural view of an array substrate provided by an embodiment of the present invention.

As shown in FIG. 1, an embodiment of the present invention provides an array substrate, which comprises: a non-bending region 100 and a bending region 200 surrounding the non-bending region 100. The array substrate comprises a base layer 1, a buffer layer 2, a functional layer 3, a filling layer 4, a metal layer 5, and a planarization layer 6 stacked in sequence. The functional layer 3 comprises an active layer 31, a first insulating layer 32, a gate 33, a second insulating layer 34, a conductive layer 35, and a third insulating layer 36 stacked in sequence. The functional layer 3 can be divided into a first portion located in the non-bending region 100 and a second portion located in the bending region 200 according to a region. A plurality of driving thin film transistors T1 are formed in the first portion, and a plurality of third openings 7 are located around each of the driving thin film transistors T1. The second portion is provided with a plurality of first openings 8. The filling layer 4 covers an upper surface of the functional layer 3 and fills the third openings 7 and the first openings 8.

The first insulating layer 32, the second insulating layer 34, and the third insulating layer 36 in the functional layer 3 are all inorganic insulating layers. The filling layer 4 covering the upper surface of the functional layer 3 is an organic material, such as polyimide. Filling the third opening 7 and the first opening 8 with the organic material can effectively improve stability of a film structure of the array substrate under dynamic bending.

The filling layer 4 is etched again at a position of the first opening 8 to form a second opening 9. The second opening 9 is smaller than the first opening 8, that is, the second opening 9 is formed in the filling layer 4 in the organic material filled in the first opening 8.

The metal layer 5 comprises a source-drain pattern 52 and a plurality of metal traces 51 connected to the source-drain pattern. The source-drain pattern 52 is connected to a source region and a drain region on the active layer 31. The plurality of metal traces 51 extend to the bending region 200. The metal trace 51 is bent toward an inside of the second opening 9 in a region overlapping with the second opening 9 and attaches to an inner surface of the second opening 9.

The planarization layer 6 covers an upper surface of the metal layer 5. Especially in the bending region 200, the planarization layer 6 fills a recessed portion formed after the metal trace 51 is bent into the second opening 9. A material of the planarization layer is preferably an organic material, especially a same material as the filling layer, so that the metal trace 51 can be sandwiched between the two organic material layers, which can effectively alleviate effect of bending stress on the metal trace 51 when bending occurs. In addition, materials on both sides of the metal trace 51 are the same or similar to prevent uneven force due to a large difference in bending stress on both sides due to different material bending characteristics.

The plurality of third openings 7 are rectangles with the same size along a horizontal cross section parallel to the film layer, and long sides of the third openings 7 are facing the driving thin film transistor T1. The third opening 7 extends downward along a depth direction of the opening perpendicular to a surface of the film layer, and passes through the functional layer 3 and the buffer layer 2. Setting the plurality of third openings 7 to be exactly the same opening is beneficial to an implementation of a photolithography process, and can prevent uneven stress distribution during bending due to different openings.

Figure 2:
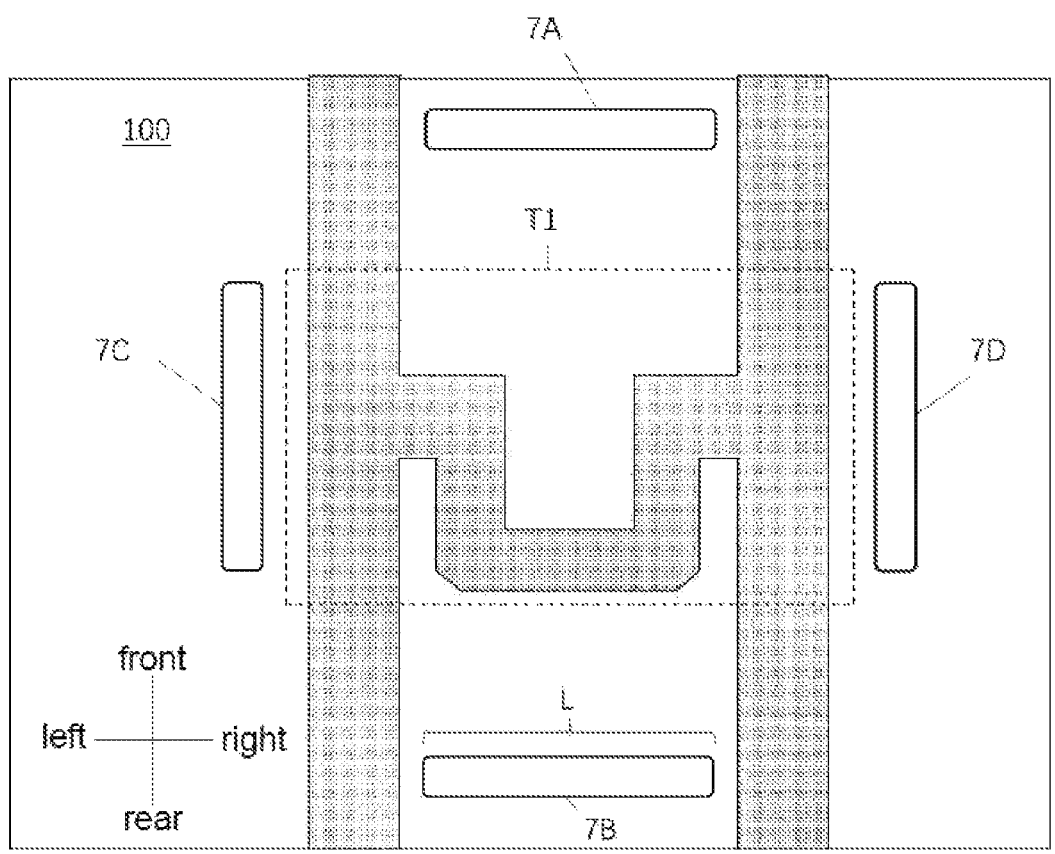
FIG. 2 is a schematic structural view of a location of a driving thin film transistor of the array substrate provided by the embodiment of the present invention.

Four third openings 7 are provided around each of the driving thin film transistors T1. As shown in FIG. 2, the four third openings 7 are respectively located in four directions of the driving thin film transistor T1. Specifically: a front third opening 7A at a front, a rear third opening 7B at a rear, a left third opening 7C on a left, and a right third opening 7D on a right. The front third opening 7A and the rear third opening 7B are located on front and rear sides of the driving thin film transistor, and the left third opening 7C and the right third opening 7D are located on left and right sides of the driving thin film transistor T1. In the embodiment, it is preferable that positions of the front third opening 7A and the rear third opening 7B are symmetrical with respect to the driving thin film transistor T1, and positions of the left third opening 7C and the right third opening 7D are symmetrical with respect to the driving thin film transistor T1.

By providing the third opening around the driving thin film transistor and filling it with organic material, bending resistance and structural stability of the array substrate can be effectively improved. The third openings arranged opposite to each other around the driving thin film transistor can effectively prevent the film structure of the functional layer of the array substrate from being detached under stress during bending, thereby preventing the threshold voltage (VTH) of the driving thin film transistor T1 from drifting due to excessive stress and causing uneven light emission. Due to uncertainty of a bending direction during dynamic bending, directions of the stress acting on the array substrate may come from multiple directions. In the embodiment, a plurality of the third openings 7 are symmetrically arranged around the driving thin film transistor, which can more uniformly relieve stress in various directions. In addition, it is preferable that the third openings 7 are all rectangular, and a long side L of the third opening 7 is directly facing the driving thin film transistor T1 when arranged, and the third opening 7 passes through the functional layer and the buffer layer along a depth of the opening to surround the driving thin film transistor as much as possible. This can alleviate an influence of stress on the driving thin film transistor to a greatest extent and ensure a stable operation of the driving thin film transistor.

Further, the third opening can also be defined around other thin film transistors to relieve the stress caused by bending and improve a stability of a device.

The second portion of the functional layer 3 in the bending region 200 is provided with a plurality of the first openings 8. An opening depth of the first opening 8 is greater than an opening depth of the third opening 7, because the bending region may need to be kept in a bent state at all times. Especially nowadays, narrow frames have become an important development trend of display panels. Due to a smaller size of the bending region, the greater the bending amplitude is, the greater stress it produces on the array substrate. Therefore, defining a larger and deeper first opening 8 in the bending region 200 and filling the openings with organic materials can greatly relieve the stress, and prevent structural damage and cracks in the bending region. In the embodiment, it is preferable that the first opening 8 extends into the base layer 1.

Further, considering that a depth of the first opening is relatively large, the first opening 8 can be divided into an upper opening 81 and a lower opening 82. The upper opening 81 and the third opening 7 are etched and formed by a same mask, and then another mask is used to etch the lower opening 82 under the upper opening. An opening depth of the upper opening 81 of the first opening is less than an opening depth of the third opening 7. This is because an opening size of the upper opening 81 of the first opening is usually greater than an opening size of the third opening, and depths of etching with a same amount of light will be different. To simplify a process, it is preferable that a horizontal cross-sectional area of the lower opening 82 is less than a horizontal cross-sectional area of the upper opening 81.

In the embodiment, the upper opening 81 and the lower opening 82 are all trapezoidal cross-sections that are wide at top and narrow at bottom along a depth direction of an opening. The upper opening 81 and the lower opening 82 are respectively formed with an upper opening and a lower opening. A cross-sectional area of the upper opening of the lower opening 82 is less than a cross-sectional area of the lower opening of the upper opening 81. In particular, the second opening 9 is also set as a trapezoidal cross-section that is wide at top and narrow at bottom along the depth direction of the opening. In this way, when the metal trace 51 is bent into the second opening 9 and is attached to an inner surface of the second opening 9, a trapezoidal structure having wide at top and narrow at bottom can also be formed accordingly, so that the metal trace 51 can be closer to a neutral surface of the array substrate as a whole, reducing applied stress after bending and protecting the metal trace 51 from damage.

In other embodiments, the metal trace 51 is at least partially attached to a bottom surface of the lower opening 82 of the first opening 8. In this way, the metal trace can be located as close to the neutral surface as possible and reduce stress on bending.

Figure 3:
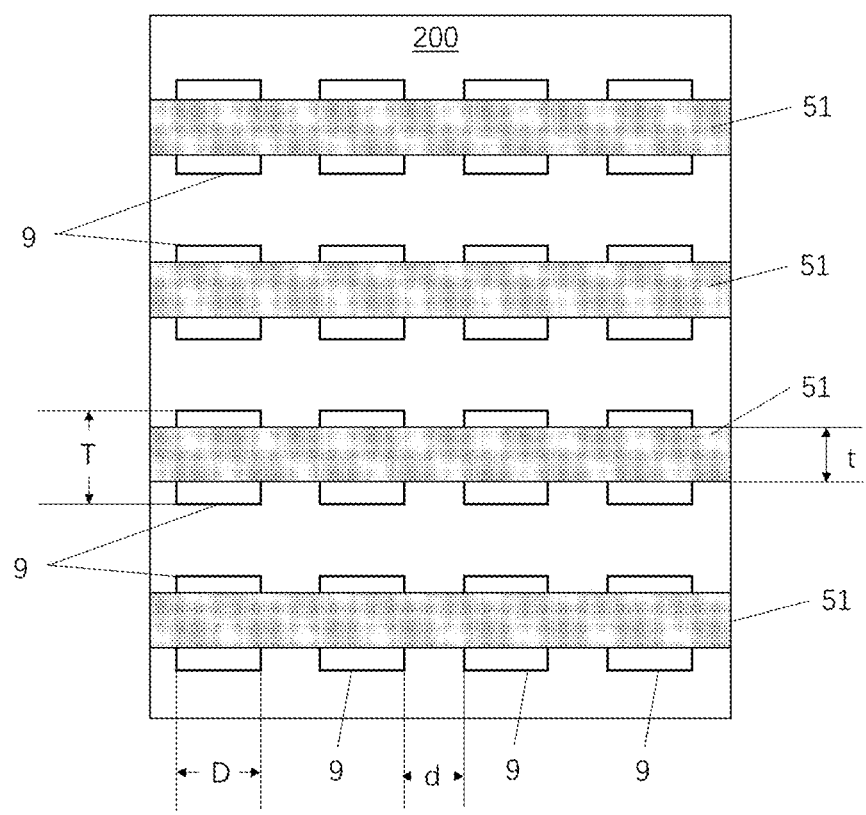
FIG. 3 is a schematic structural view of a bending region of the array substrate provided by the embodiment of the present invention.

Referring to FIG. 3, in some embodiments, a plurality of the second openings 9 of the same size and depth are arranged in an array in the bending region 200. The second openings 9 in a same row are arranged equidistantly along an extension direction of the metal trace 51, and overlap one of the metal traces 51. A maximum opening length D of the second opening 9 along the extension direction of the metal trace 51 is greater than a distance d between two adjacent second openings along the extension direction of the metal trace. Further, it is preferable that the maximum opening length D of the second opening 9 along the extension direction of the metal trace 51 is twice the distance d between two adjacent second openings 9 along the extension direction of the metal trace. Preferably, the maximum opening length D of the second opening 9 along the extension direction of the metal trace 51 is 8 um, and the distance d between two adjacent second openings 9 along the extension direction of the metal trace is 4 um. An opening width T of the second opening 9 along the extension direction perpendicular to the metal trace 51 is greater than a width t of the metal trace along the extension direction perpendicular to the metal trace 51. Preferably, the opening width T of the second opening 9 perpendicular to the extension direction of the metal trace 51 is 9.8 um, and the width t of the metal trace 51 perpendicular to the extension direction thereof is 7.4 um.

Figure 4:
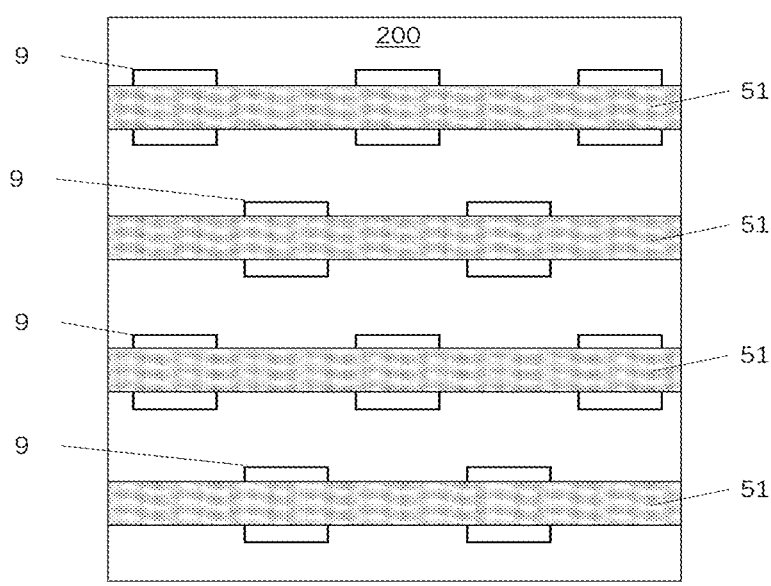
FIG. 4 is another schematic structural view of the bending region of the array substrate provided by the embodiment of the present invention.

As shown in FIG. 3, two adjacent rows of the second openings 9 defined along the extension direction of the metal trace 51 are defined in parallel in pairs. In other embodiments, as shown in FIG. 4, two adjacent rows of the second openings 9 defined along the extension direction of the adjacent metal traces 51 are defined in a staggered manner.

This can make an overall force in the bending region more uniform, which is conducive to an improvement of bending resistance.

The embodiment of the present invention further comprises providing a display device including the array substrate.

It is understandable that for those of ordinary skill in the art, equivalent replacements or changes can be made according to the technical solution of the present invention and its inventive concept, and all these changes or replacements shall fall within the protection scope of the claims of the present invention.

What is claimed is:

1. An array substrate, comprising:
    a bending region and a non-bending region; and
    a base layer, a buffer layer, a functional layer, a filling layer, and a metal layer stacked in sequence;
    wherein the functional layer comprises a first portion located in the non-bending region and a second portion located in the bending region, the first portion is provided with a plurality of driving thin film transistors, and the second portion is provided with one or more first openings;
    the filling layer covers an upper surface of the functional layer and fills the first openings, and the filling layer is provided with one or more second openings at the first openings; and
    the metal layer comprises a source-drain pattern and a plurality of metal traces connected to the source-drain pattern, and each of the metal traces is bent toward an inside of a corresponding second opening in a region overlapping the corresponding second opening,
    wherein each of the second openings exposes a bottom surface of a corresponding first opening, and each of the metal traces is at least partially attached to the bottom surface of a corresponding first opening.

2. The array substrate as claimed in claim 1, wherein each of the first openings extends into the base layer and passes through a portion of the base layer.

3. The array substrate as claimed in claim 2, wherein each of the first openings comprises an upper opening and a lower opening, the lower opening is located below the upper opening, and a maximum horizontal cross-sectional area of the lower opening is less than a minimum horizontal cross-sectional area of the upper opening.

4. The array substrate as claimed in claim 3, wherein the upper opening, the lower opening, and each second opening are all trapezoidal cross-sections that are wide at top and narrow at bottom along a depth direction of the upper opening, the lower opening, and each second openings.

5. The array substrate as claimed in claim 4, wherein each of the metal traces is at least partially attached to a bottom surface of a lower opening of a corresponding first opening.

6. The array substrate as claimed in claim 1, wherein each of the metal traces overlaps a plurality of second openings of the second openings, and the plurality of second openings are arranged at equal distances from each other along an extension direction of a corresponding one of the metal traces.

7. The array substrate as claimed in claim 6, wherein a maximum opening length of each of the plurality of second openings along the extension direction of the corresponding one of the metal traces is greater than a distance between two adjacent second openings of the plurality of second openings along the extension direction of the corresponding one of the metal traces, and an opening width of each of the plurality of second openings perpendicular to the extension direction of the corresponding one of the metal traces is greater than a width of the corresponding one of the metal traces.

8. The array substrate as claimed in claim 6, wherein second openings of two rows respectively arranged along two adjacent metal traces are arranged in a staggered manner.

9. The array substrate as claimed in claim 1, wherein each of the driving thin film transistors is provided with a plurality of third openings on a periphery of a corresponding driving thin film transistor of the driving thin film transistors, the plurality of third openings are symmetrically arranged with respect to the corresponding driving thin film transistor, a horizontal cross-section of each of the plurality of third openings is a rectangle with a same size, and a long side of each of the plurality of third openings faces the corresponding driving thin film transistor.

10. The array substrate as claimed in claim 9, wherein each of four sides of the corresponding driving thin film transistor is provided with one third opening, four third openings at the four sides of the corresponding driving thin film transistor are symmetrically arranged with respect to the corresponding driving thin film transistor, each of the four third openings passes through the functional layer and the buffer layer along a depth direction of each of the four third openings, and the filling layer fills each of the four third openings.

11. A display device, comprising: an array substrate, wherein the array substrate comprises a bending region and a non-bending region, and a base layer, a buffer layer, a functional layer, a filling layer, and a metal layer stacked in sequence;
    wherein the functional layer comprises a first portion located in the non-bending region and a second portion located in the bending region, the first portion is provided with a plurality of driving thin film transistors, and the second portion is provided with one or more first openings;
    the filling layer covers an upper surface of the functional layer and fills the first openings, and the filling layer is provided with one or more second openings at the first openings; and
    the metal layer comprises a source-drain pattern and a plurality of metal traces connected to the source-drain pattern, and each of the metal traces is bent toward an inside of a corresponding second opening in a region overlapping the corresponding second opening,
    wherein each of the second openings exposes a bottom surface of a corresponding first opening, and each of the metal traces is at least partially attached to the bottom surface of a corresponding first opening.

12. The display device as claimed in claim 11, wherein each of the first openings extends into the base layer and passes through a portion of the base layer.

13. The display device as claimed in claim 12, wherein each of the first opening comprises an upper opening and a lower opening, the lower opening is located below the upper opening, and a maximum horizontal cross-sectional area of the lower opening is less than a minimum horizontal cross-sectional area of the upper opening.

14. The display device as claimed in claim 13, wherein the upper opening, the lower opening, and each second opening are all trapezoidal cross-sections that are wide at top and narrow at bottom along a depth direction of the upper opening, the lower opening, and each second opening.

15. The display device as claimed in claim 14, wherein each of the metal traces is at least partially attached to a bottom surface of a lower opening of a corresponding first opening.

16. The display device as claimed in claim 11, wherein each of the metal traces overlaps a plurality of second openings of the second openings, and the plurality of second openings are arranged at equal distances from each other along an extension direction of a corresponding one of the metal traces.

17. The display device as claimed in claim 16, wherein a maximum opening length of each of the plurality of second openings along the extension direction of the corresponding one of the metal traces is greater than a distance between two adjacent second openings of the plurality of second openings along the extension direction of the corresponding one of the metal traces, and an opening width of each of the plurality of second openings perpendicular to the extension direction of the corresponding one of the metal traces is greater than a width of the corresponding one of the metal traces.

18. The display device as claimed in claim 16, wherein second openings of two rows respectively arranged along two adjacent metal traces are arranged in a staggered manner.

19. The display device as claimed in claim 11, wherein each of the driving thin film transistors is provided with a plurality of third openings on a periphery of a corresponding driving thin film transistor of the driving thin film transistors, the plurality of third openings are symmetrically arranged with respect to the corresponding driving thin film transistor, a horizontal cross-section of each of the plurality of third openings is a rectangle with a same size, and a long side of each of the plurality of third openings faces the corresponding driving thin film transistor.

20. The display device as claimed in claim 19, wherein each of four sides of the corresponding driving thin film transistor is provided with one third opening, four third openings at the four sides of the corresponding driving thin film transistor are symmetrically arranged with respect to the corresponding driving thin film transistor, each of the four third openings passes through the functional layer and the buffer layer along a depth direction of each of the four third openings, and the filling layer fills each of the four third openings.

* * * * *